United States Patent [19]

Wilkins et al.

[11] Patent Number: 4,965,607
[45] Date of Patent: Oct. 23, 1990

[54] ANTENNA COUPLER

[75] Inventors: Mark L. Wilkins; Alvin O. Wong, both of San Jose, Calif.

[73] Assignee: BR Communications, Inc., Sunnyvale, Calif.

[21] Appl. No.: 44,960

[22] Filed: Apr. 30, 1987

[51] Int. Cl.[5] ............................................. H04B 1/02
[52] U.S. Cl. ................................. 343/861; 343/860; 455/123
[58] Field of Search ............... 343/861, 860, 850, 853; 455/123

[56] References Cited

U.S. PATENT DOCUMENTS

| 3,601,717 | 8/1971 | Kuecken | 343/861 |
| 4,493,112 | 1/1985 | Bruene | 343/861 |
| 4,545,059 | 10/1985 | Spinks, Jr. et al. | 455/123 |
| 4,612,669 | 9/1986 | Nossen | 343/861 |
| 4,672,686 | 6/1987 | Raoux et al. | 455/123 |

FOREIGN PATENT DOCUMENTS 0131216  6/1978  Fed. Rep. of Germany ...... 343/861

Primary Examiner—William L. Sikes
Assistant Examiner—Doris J. Johnson
Attorney, Agent, or Firm—Flehr, Hohbach, Test, Albritton & Herbert

[57] ABSTRACT

An automatic antenna coupler is disclosed. The antenna coupler automatically matches the output impedance of a 50-ohm transmitter to the input impedance of a non-broad-band antenna, such as a whip, dipole or long wire. The resulting increase in transmit coupling efficiency provides greater radiative power than that available from an unmatched antenna.

12 Claims, 19 Drawing Sheets

ANTENNA COUPLER BLOCK DIAGRAM

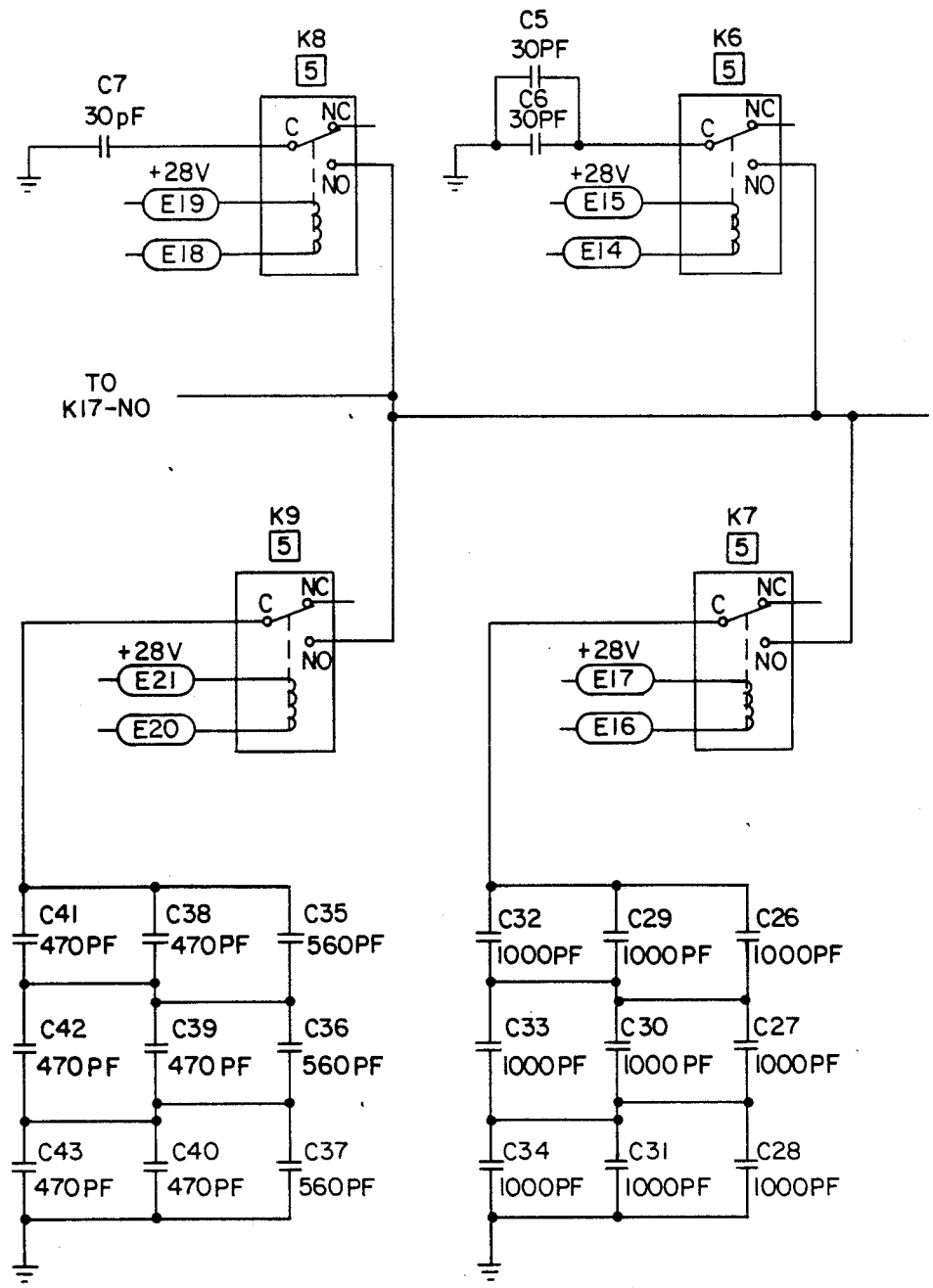
FIG.—4A

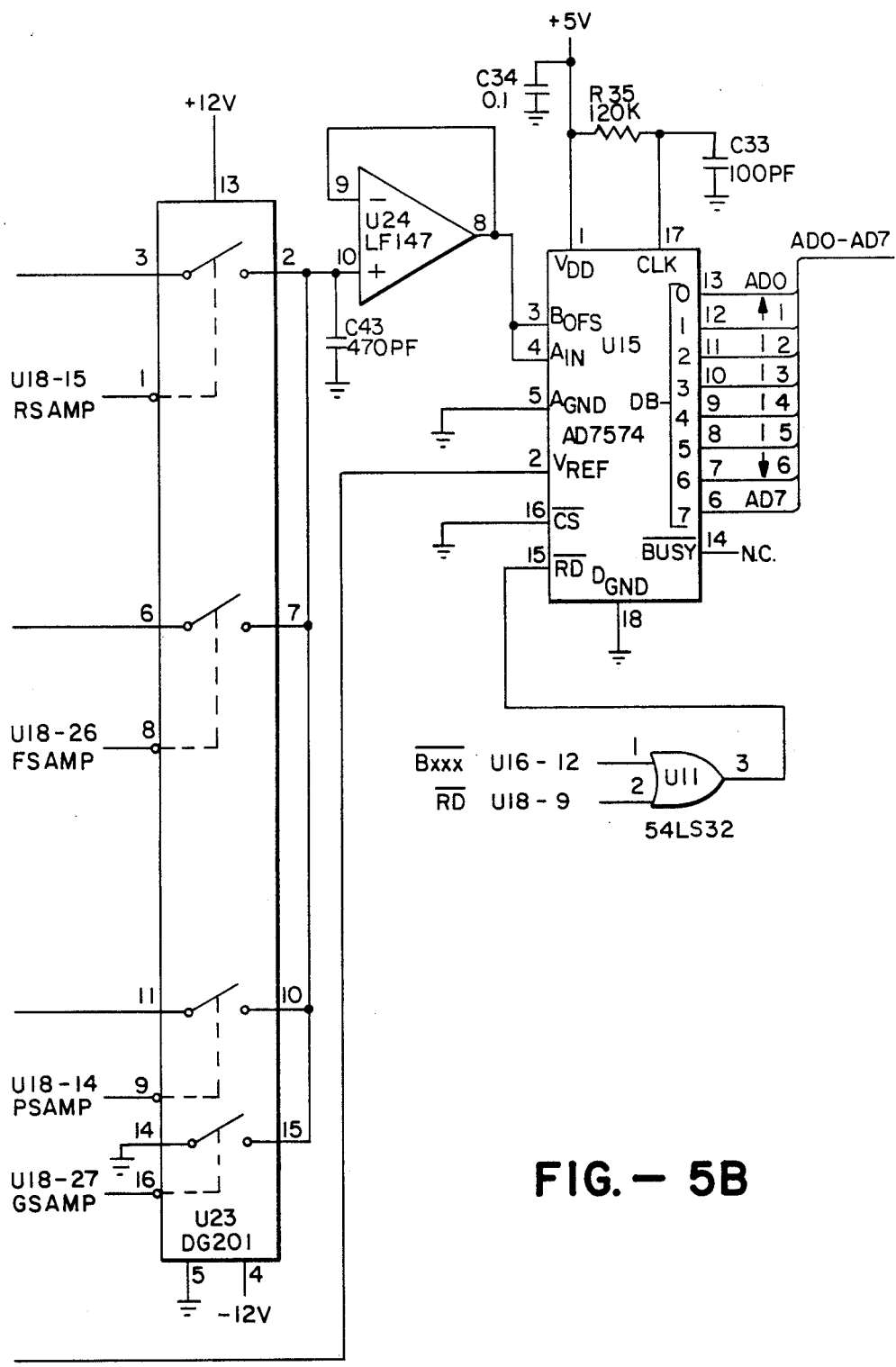
FIG.—5B

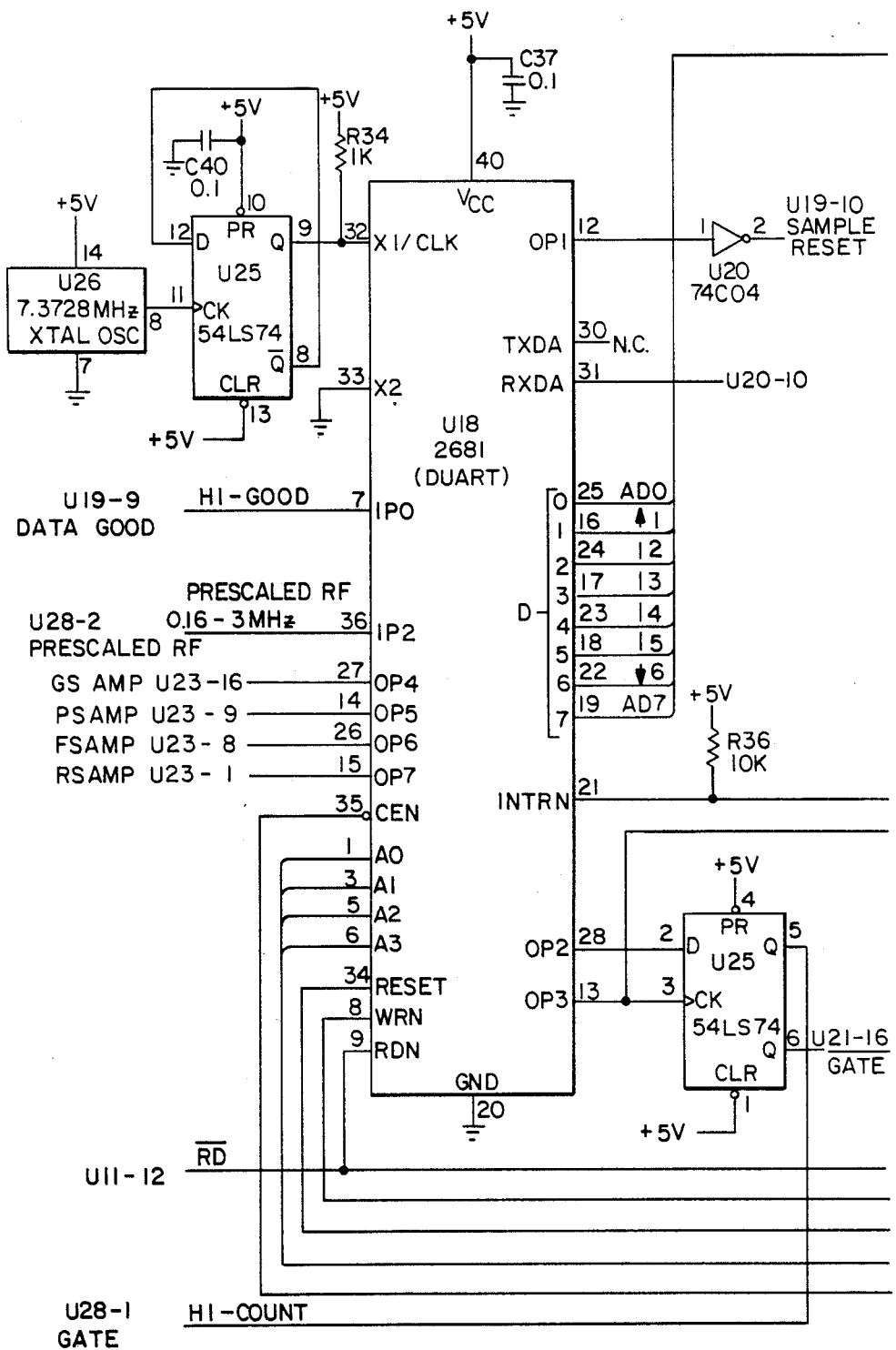
FIG.—6A

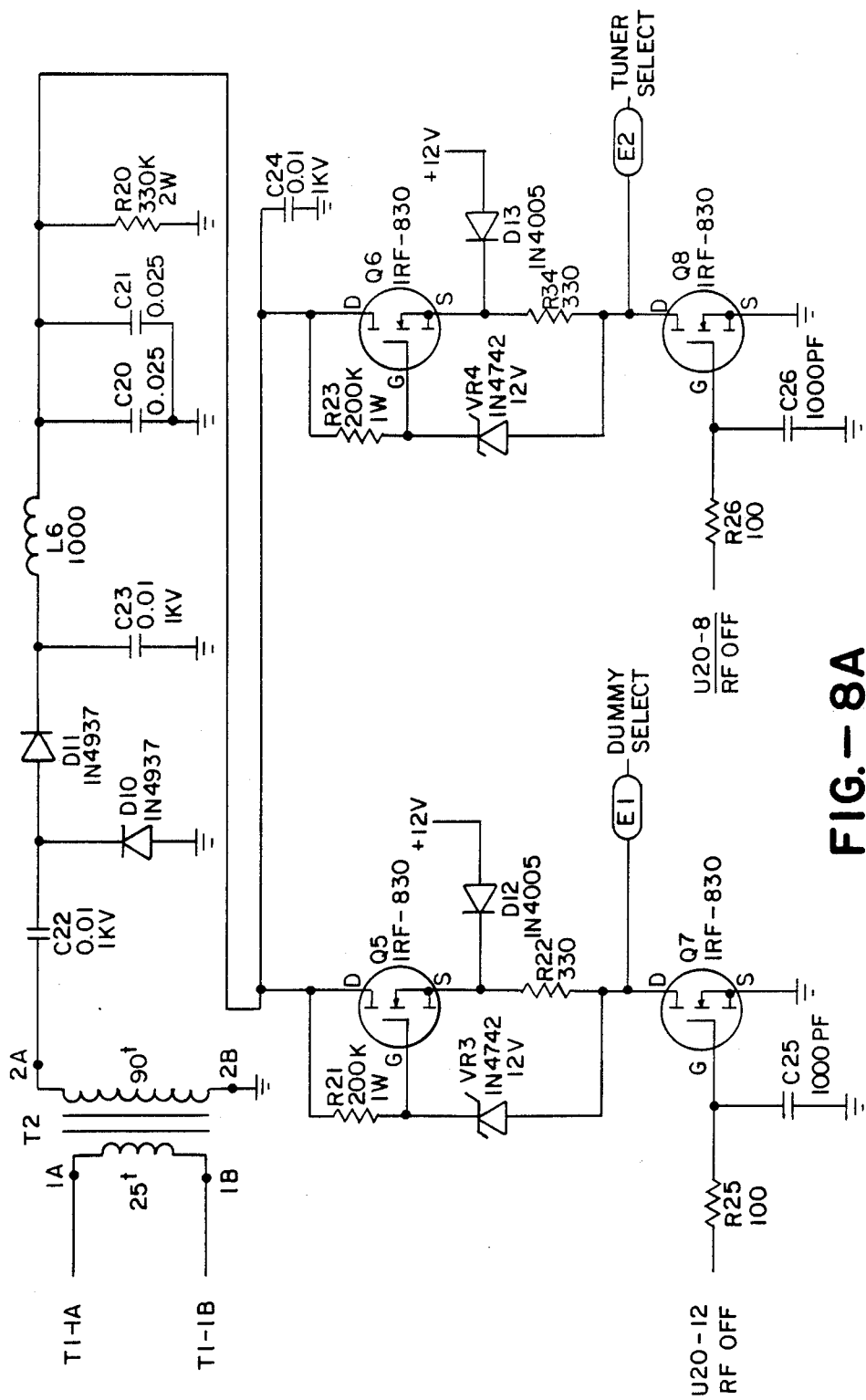
FIG.—8A

ANTENNA COUPLER

BACKGROUND OF THE INVENTION

The present invention relates to an antenna coupler for use in a RF (Radio Frequency) transmitting system.

The two major components of a transmitting station are the transmitter and the antenna. The transmitter generates a high power RF signal and the antenna receives this signal and radiates it. To insure that most of the RF power is properly coupled to the antenna, the antenna must match the output impedance of the transmitter. Unfortunately, in broadband HF systems, unless a large elaborate antenna system is employed, the antenna will not provide a good impedance match over the entire frequency range. Therefore, for simple antenna installations, a device called an antenna coupler must be used to maximize the radiated power of the station.

An antenna coupler is a variable impedance matching network designed to match the impedance of the antenna to that of the transmitter. It is usually composed of an L-network or a T-network using servo driven, variable capacitors and roller inductors, although more modern implementations use digitally switched inductor and capacitor banks. They also include simple impedance detectors and control logic to facilitate automatic tuning.

Each time the frequency is changed, the antenna coupler must go through a tune sequence. This involves setting the network to a known home position, and then while transmitting, changing one of the elements in one direction until a desired condition takes place, as for instance, the sign of the phase changing. Then another element of the network is changed in a desired direction until its desired condition occurs, bringing the coupler to a closer match. This process is repeated until the desired impedance match is obtained and the process stops. Normally, the tune sequence takes a few seconds to complete. Unfortunately, the tune sequence of such tuners is too slow to track FM CW signals (or swept signals) or to avoid detection by direction finding equipment in a military environment.

SUMMARY OF THE INVENTION

It is an object of the invention to provide for an automatic antenna coupler for use in swept high frequency (HF) transmission systems.

It is a more particular object of the present invention to provide for an automatic antenna coupler which is suitable for use in a range from 1.6–30 MHz.

The present invention provides an automatic antenna coupling capability and includes adjustable impedance matching means for matching the output impedance of a transmitter to the input impedance of a non-broadband antenna. In one preferred embodiment, the coupler further includes means for tracking the frequency of a swept transmitted signal and means responsive to the tracked signal for automatically adjusting the adjustable impedance matching means to provide proper impedance matching.

Other objects, features and advantages of the present invention will become apparent from the following detailed description when taken in conjunction with the accompanying drawings.

BRIEF DESCRIPTION OF THE DRAWINGS

FIGS. 2, 3A, 3B, 4A, 4B, 5A, 5B, 6A, 6B, 7A, 7B, 8A, 8B, 9A, 10A, 10B, and 10C depict schematic diagrams of the antenna coupler depicted in FIG. 1.

DETAILED DESCRIPTION OF THE DRAWINGS

The aspects of the automatic antenna coupler according to the present invention will now be described in conjunction with FIGS 1–10.

The automatic antenna coupler according to the present invention is an automatically tuned network that, in one preferred embodiment, matches the output impedance of typically a 50-ohm transmitter to the input impedance of a non-broadband antenna, such as a whip, dipole or long wire. The resulting increase in transmit coupling efficiency provides greater radiated power than that available from an unmatched antenna. The present invention is designed for use with any 1-150 watt HF (high frequency) transmitter operating from 1.6 to 30 MHz.

Figure 1:
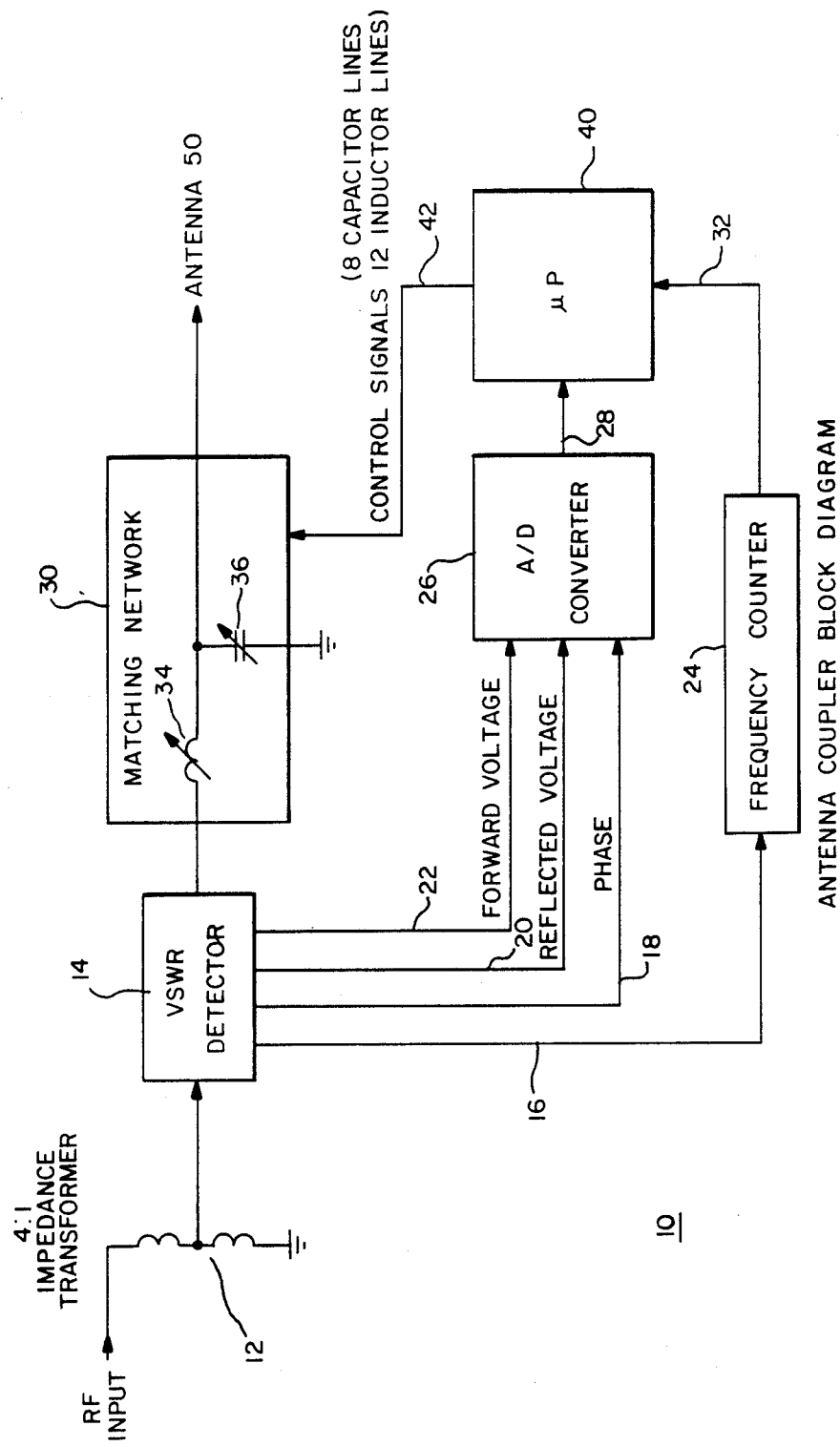
FIG. 1 depicts block diagram of an antenna coupler according to the present invention.

FIG. 1 depicts a block diagram of an antenna coupler according to the present invention. In FIG. 1, an RF (radio frequency) input signal is input to a 4:1 impedance transformer 12. A suitable VSWR (voltage standing wave ratio) detector 14 provides suitable detection of forward voltage 22, reflected voltage 20, phase 18 and frequency 16 of the RF input.

An A/D converter 26 receives the forward voltage signal 22, reflected voltage signal 20 and phase signal 18, and provides appropriate corresponding digital signals on lead 28 to microprocessor 40.

Frequency counter 24 receives the frequency detected signal on lead 16, and provides a suitable frequency signal to microprocessor 40 on lead 32.

The present invention includes a suitable adjustable or adaptable matching network 30 which includes adjustable inductors 34 and adjustable capacitors 36. Matching network 30 is controlled by control signals on lead 42 from microprocessor 40. The control signals on lead 42 include, in one embodiment, eight capacitor leads and twelve inductor leads—a total of twenty lines.

The reason most antenna couplers take so long to tune is the fact that it is unknown how much an element needs to be changed. Therefore, it is changed incrementally in one direction until a predefined condition is met. If the coupler were implemented with digitally switched elements, and the desired value of the elements could be calculated accurately, then the antenna coupler tune sequence could be reduced to the time it takes to select those elements, i.e., the relay settling time. This is what the present invention accomplishes.

In one preferred embodiment, the coupler according to the present invention includes an L-network using relay switched shunt capacitors and series inductors. The RF from the transmitter passes through a 4:1 RF transformer 12 to give a nominal impedance of 12.5 ohms. Then it passes through a directional coupler or detector to the network 20. One of the important aspects of the coupler is the directional coupler 14. The forward (22) and reflected (20) outputs are fed to an accurate phase detector and the measured phase and amplitudes of the forward and reflected voltages are read into microprocessor 40 with an A/D converter 26. Consequently, microprocessor 40 has an accurate measurement of the impedance, and therefore can calculate the needed inductance to match the antenna 50.

In one embodiment, the series inductor section was composed of eleven binary weighted inductors connected in a parallel fashion. The largest inductor was 82.0 uH. The inductance value is selected by a binary number N. Therefore, the relationship between inductance and N is 82/N uH, and inductive reactance and N would be 82.0*w/N, where w is the frequency in radians/sec.

If the inductor was set at N1 and the inductive reactance needs to be changed by dX, then the new value of N, N2 would be determined by solving the following equation:

$$82.0E-6*w/N2-82.0E-6*w/N1=dX$$

or $$N2=82.0E-6*w*N1/(82.0E-6*w+dX*N1)$$

The present invention is a "smart" coupler which can learn (i.e., measure, correct and store) the tuning characteristics of an antenna for all frequencies from 2 to 30 MHz in one sweep of a transmitter. While tuned to a fixed frequency or following a Chirp sweep, the coupler divides the 2-30 MHz range into discrete bands as narrow as 20 kHz, then learns and stores the values of the required matching network for each band. Typical tuning time during the learning process is 100 milliseconds per frequency band. After learning, all tuning corrections are recalled from non-volatile memory and will be completed in less than 20 milliseconds per frequency for both sweeps and fixed frequencies (SSB/CW), even when following widely spaced frequency jumps or hops. If the antenna characteristics change (due to ice loading, salt, sag, damage, etc.) the coupler automatically reverts to the learn mode.

During the learning process, the present invention uses impedance detectors and a microprocessor algorithm to measure the antenna impedance and compute the LC matching network required to match the antenna to 50 ohms. Whenever a frequency change is detected, a built-in frequency counter measures the input RF frequency and the microprocessor checks the tuning match. If the antenna match check shows a VSWR greater than 2.5:1, the microprocessor 40 will adjust the matching network to reduce the VSWR to less than 1.5:1. The inductors and capacitors are switched into the matching network by relays controlled by the microprocessor. Because the microprocessor computes the inductance and capacitance based on impedance measurements, fewer steps are required to tune. Iterative search methods such as the common "return to home and search for 50 ohms" technique are not used, greatly reducing tuning time and relay chatter. To extend relay life, the relays are cold-switched by momentarily PIN-diode-switching the input RF to an internal 50 ohm dummy load during tuning operations.

Antennas of very high VSWR will be matched as closely as possible to 50 ohms, limited only by the coupler's tuning elements. When antenna VSWRs exceed 10:1, the match presented to the transmitter may exceed 2.5:1.

The present invention can also be used to tune an antenna in the receive mode. On a previously learned antenna, the transmitter can send a receive frequency command to the antenna coupler. The coupler will recall the matched network settings from memory and tune the antenna to that frequency without a transmit tune sequence.

Figure 2:
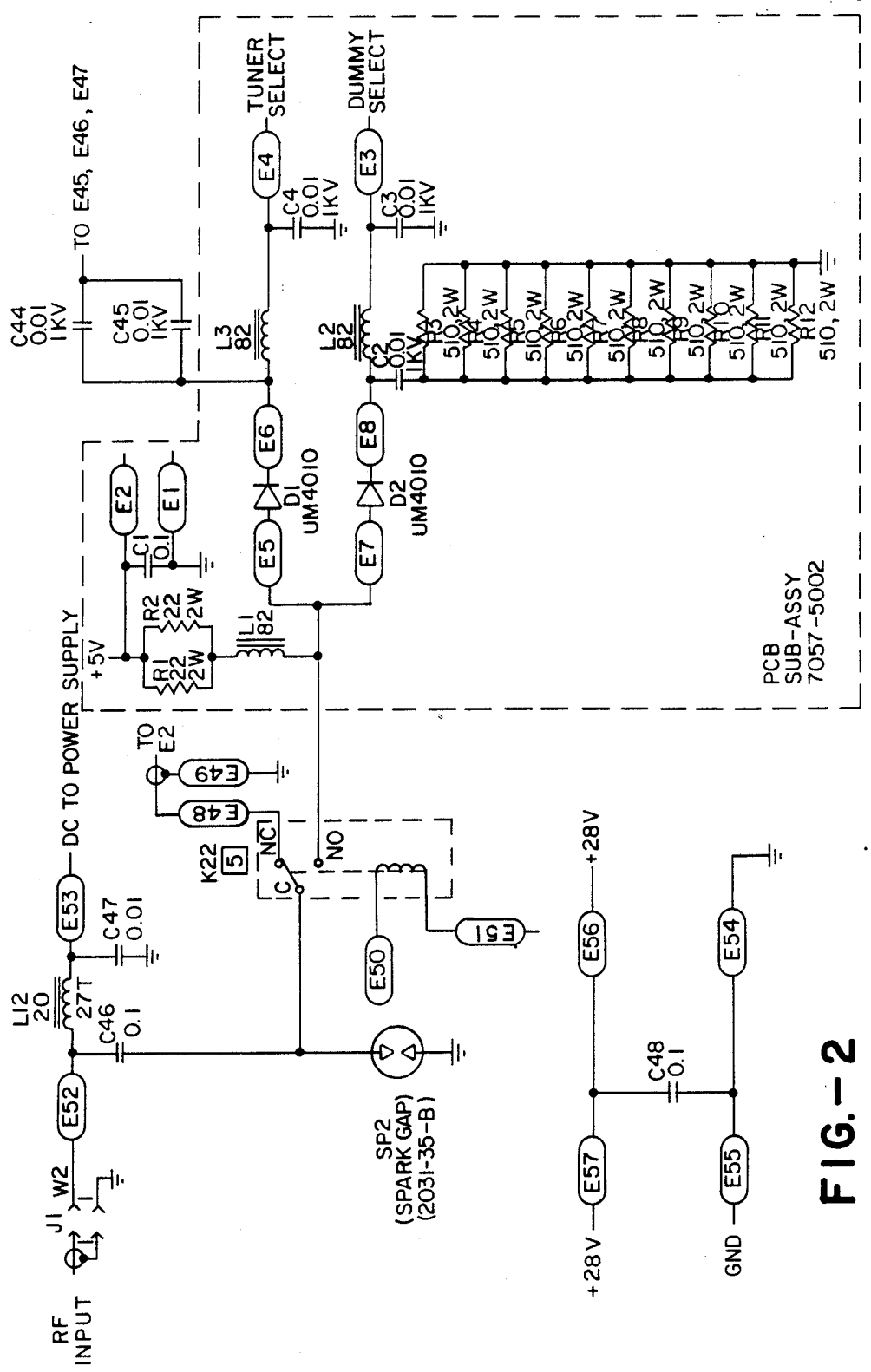
Figure 3A:
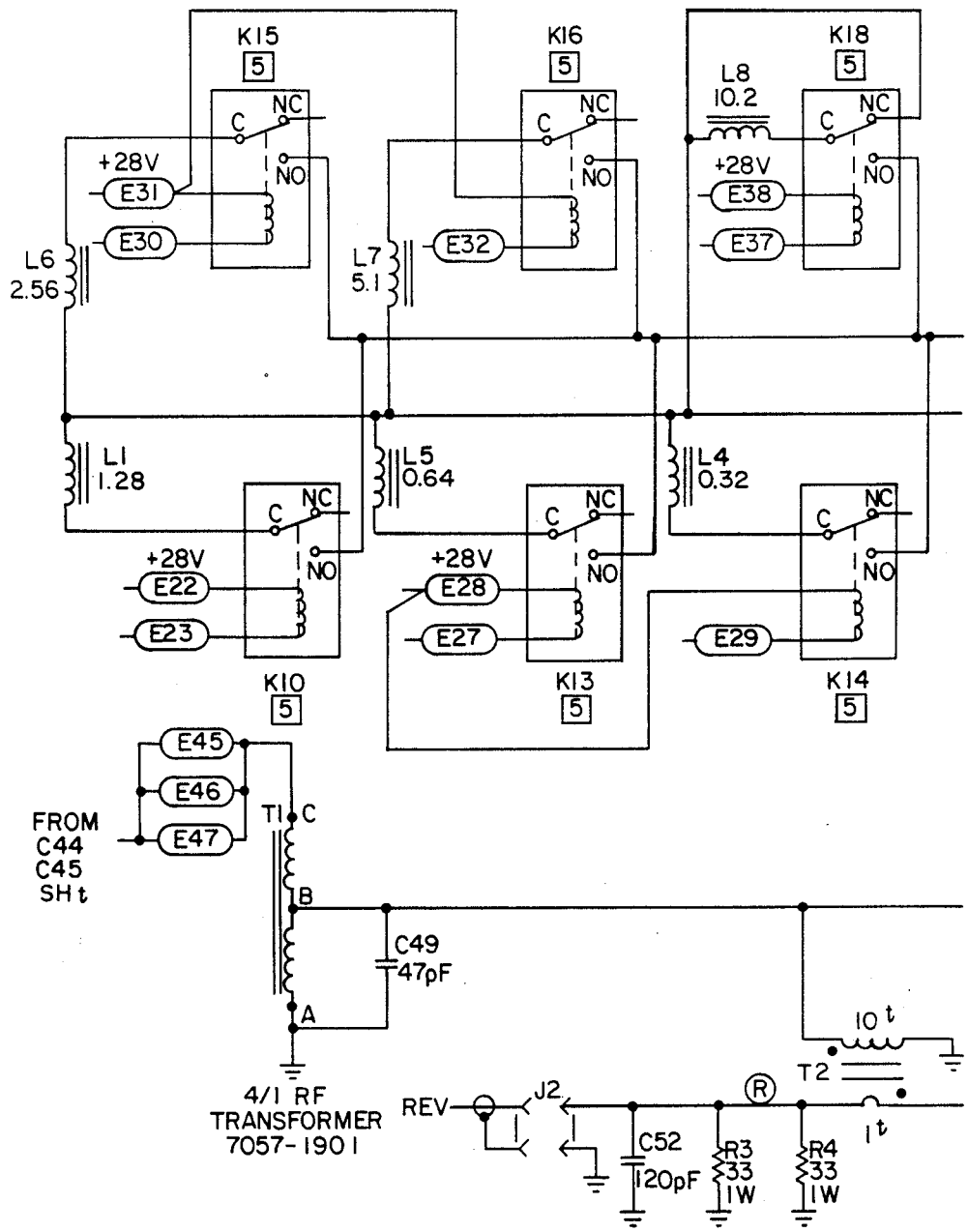
Figure 3B:
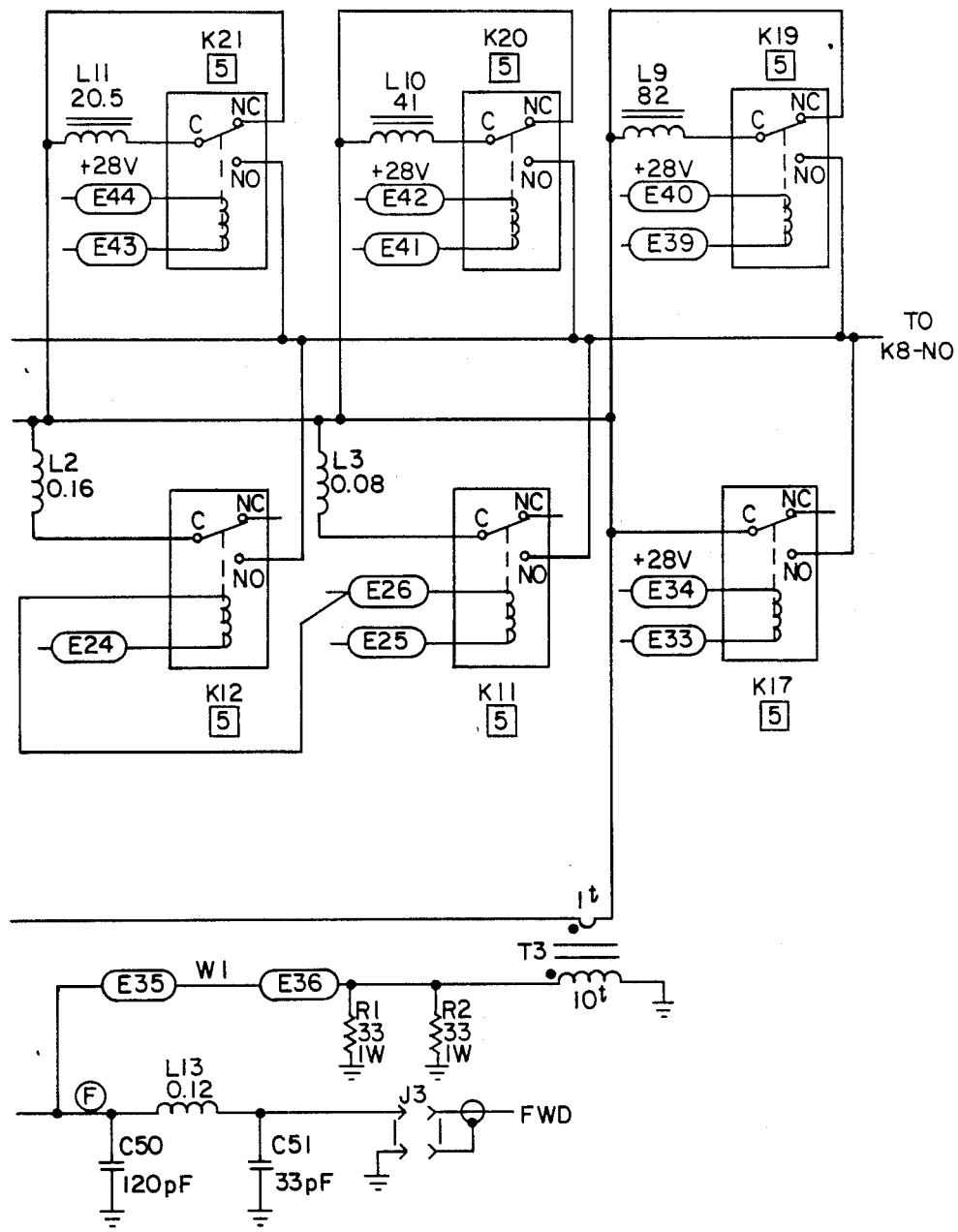
Figure 4B:
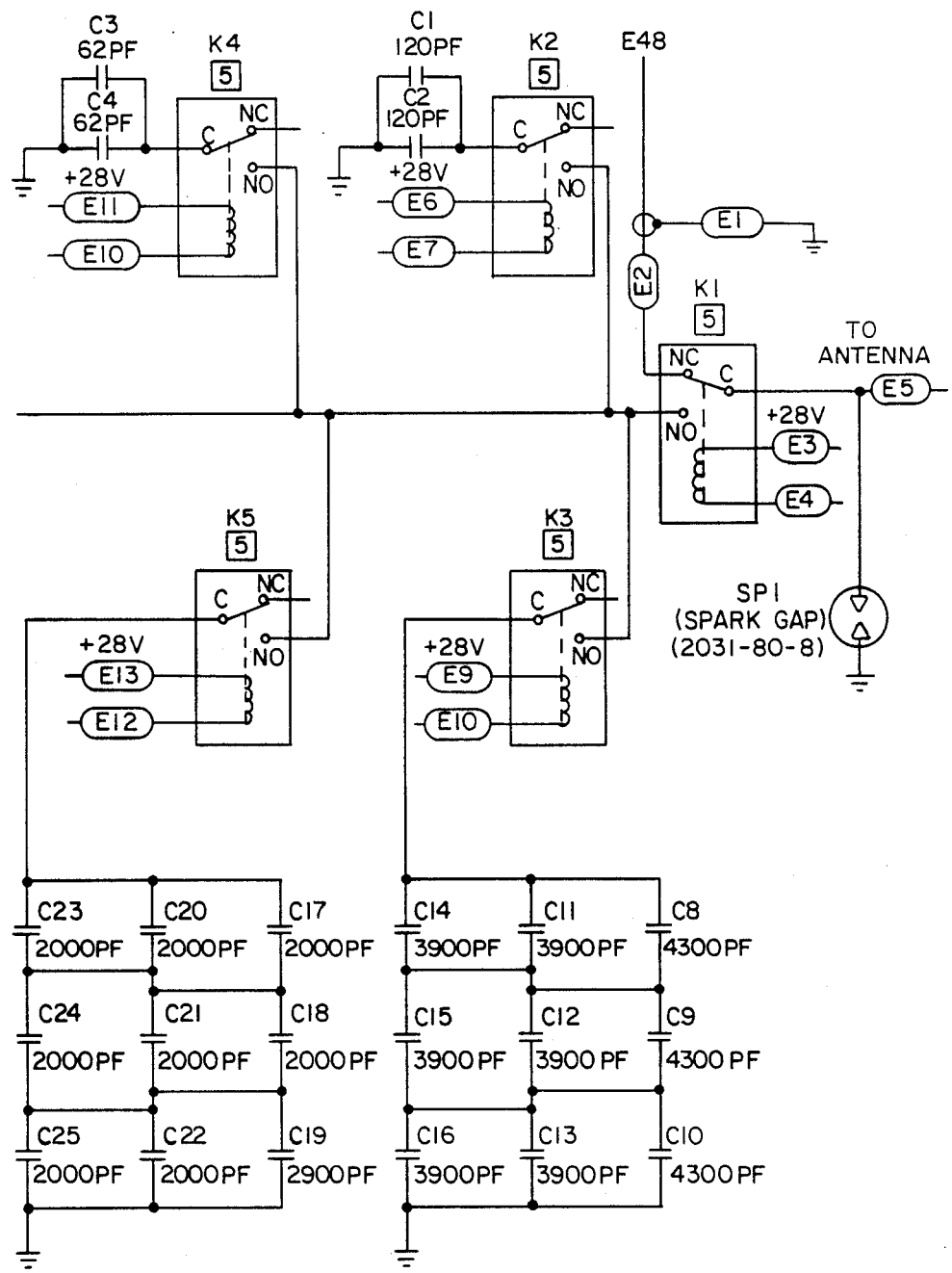
Figure 5A:
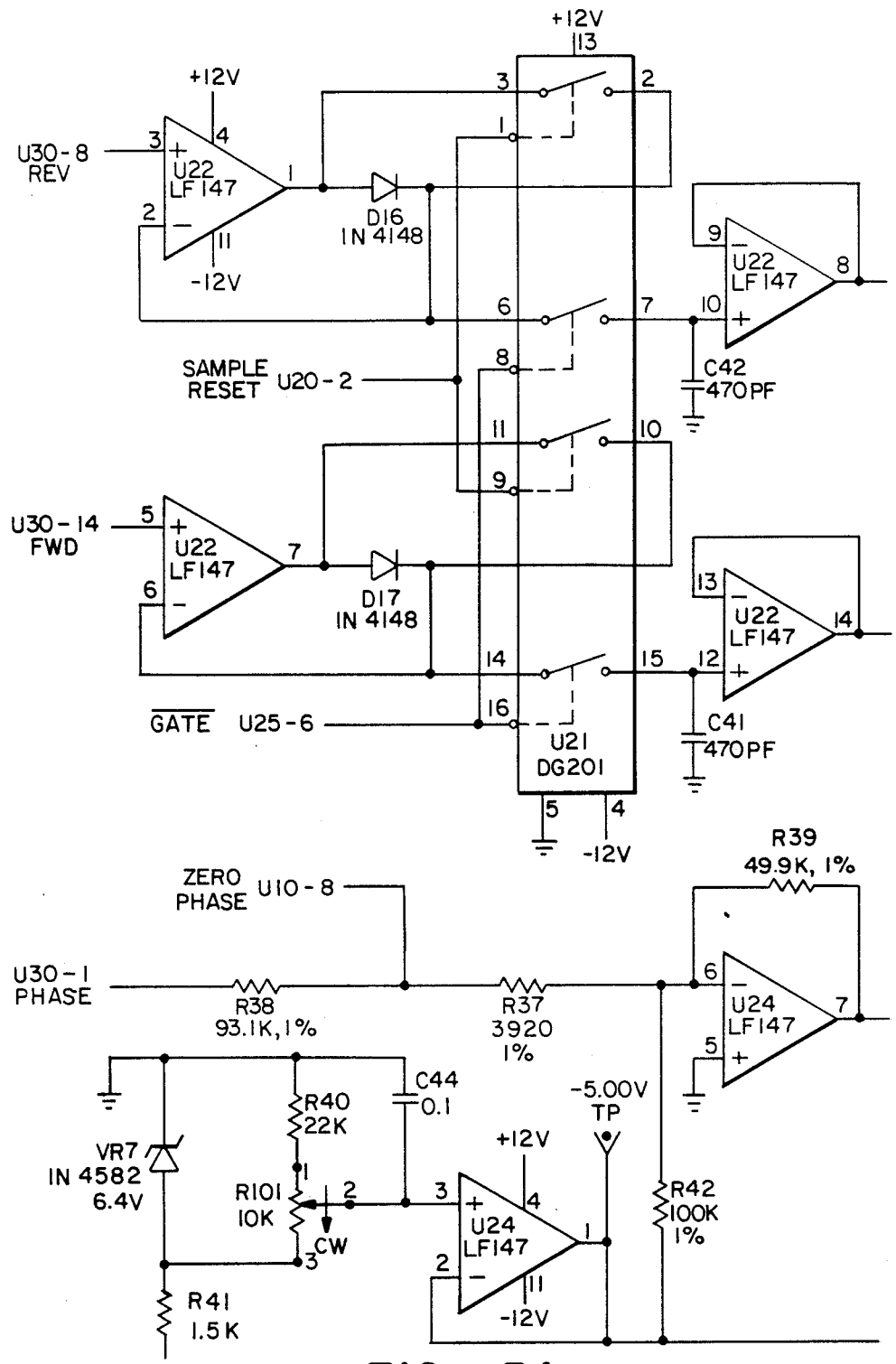
Figure 6B:
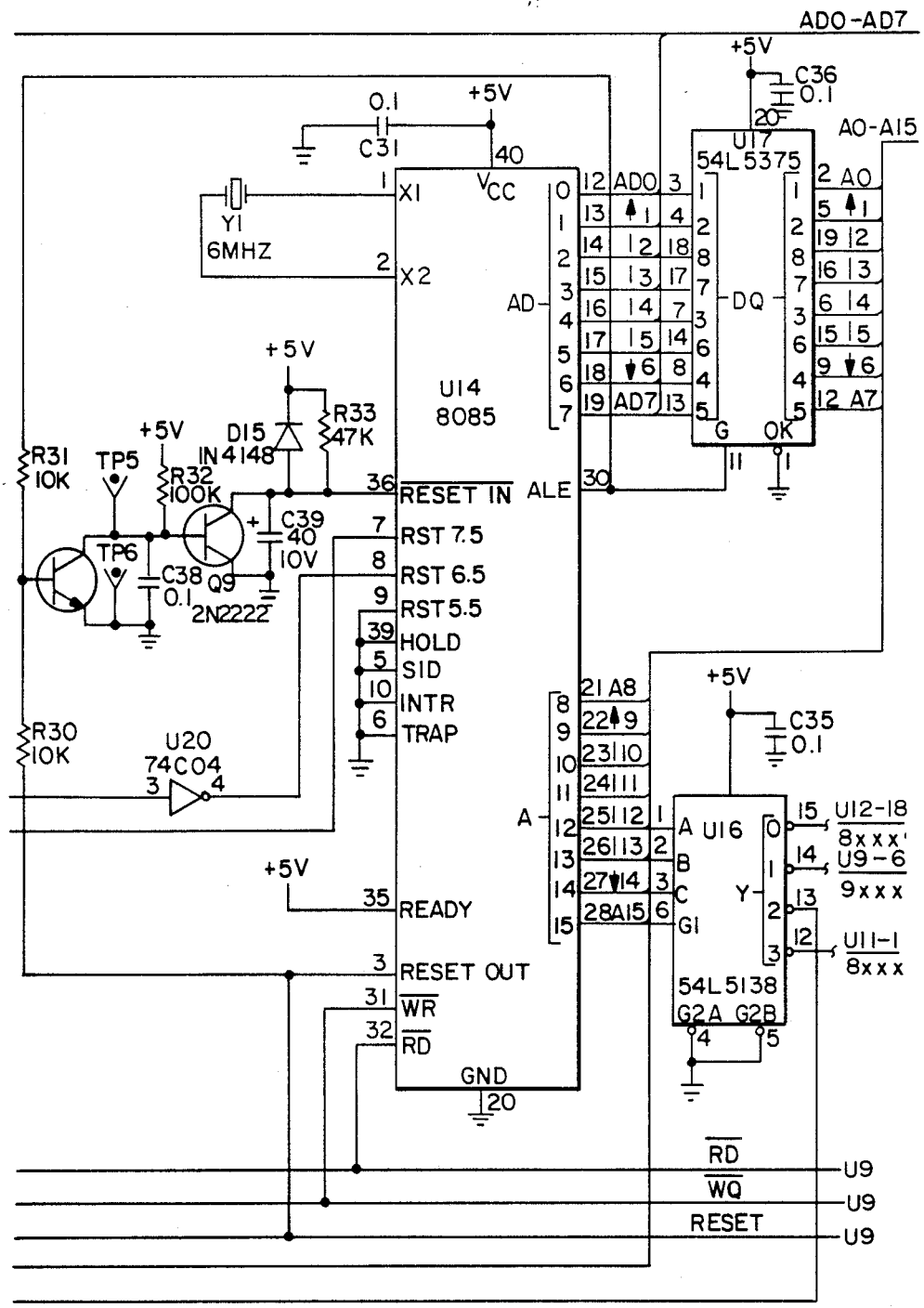
Figure 7A:
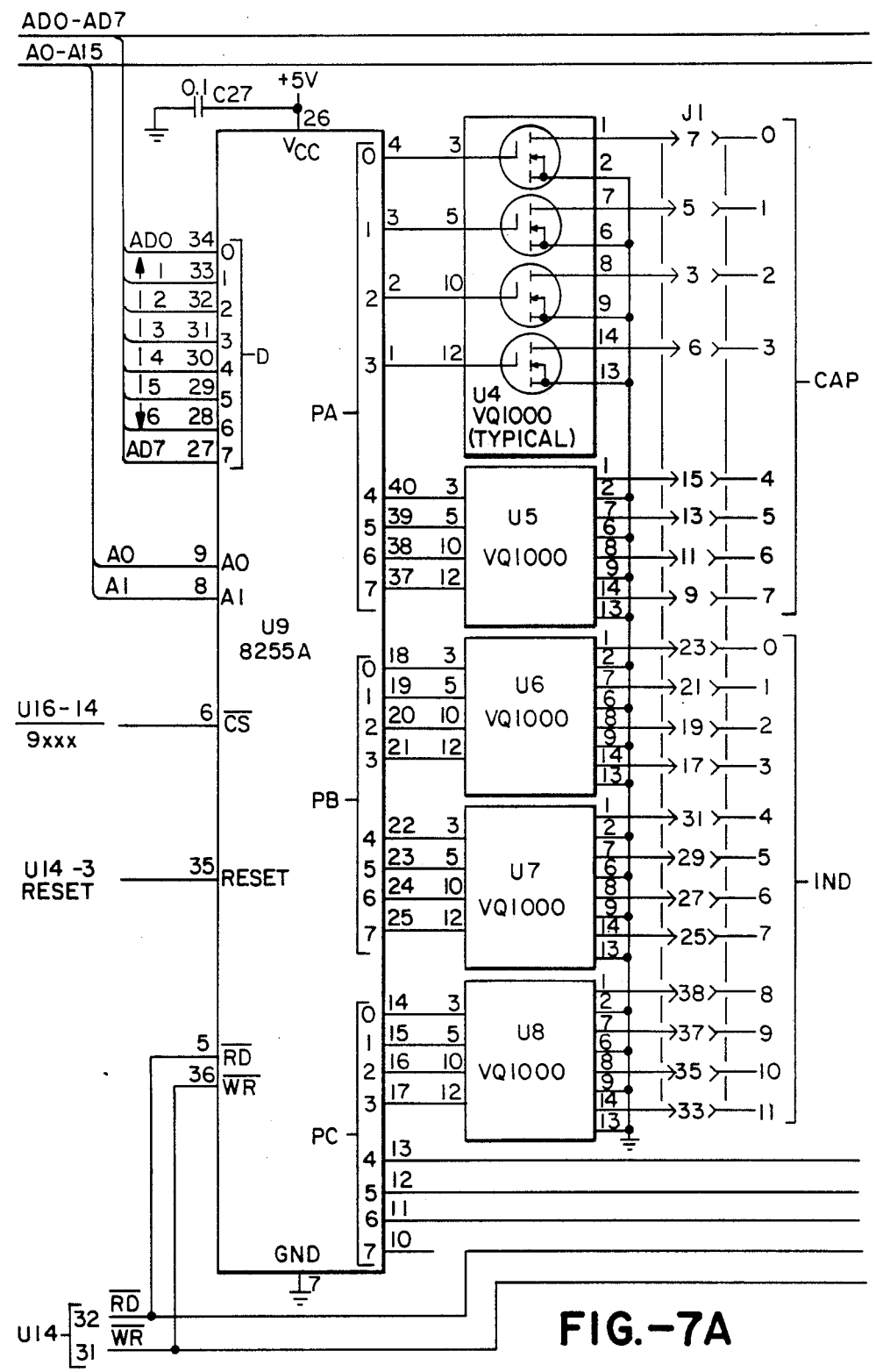
Figure 7B:
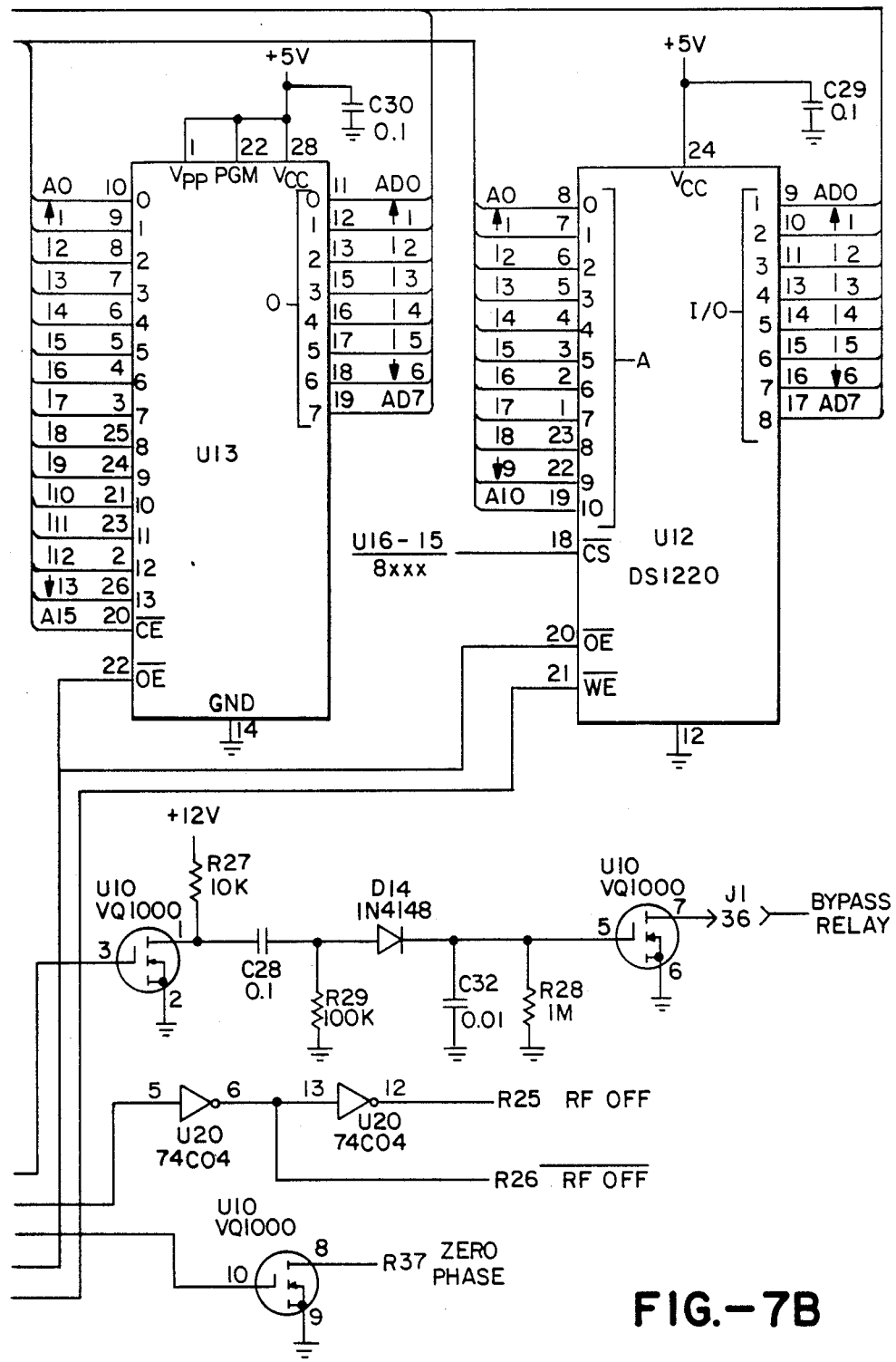
Figure 8B:
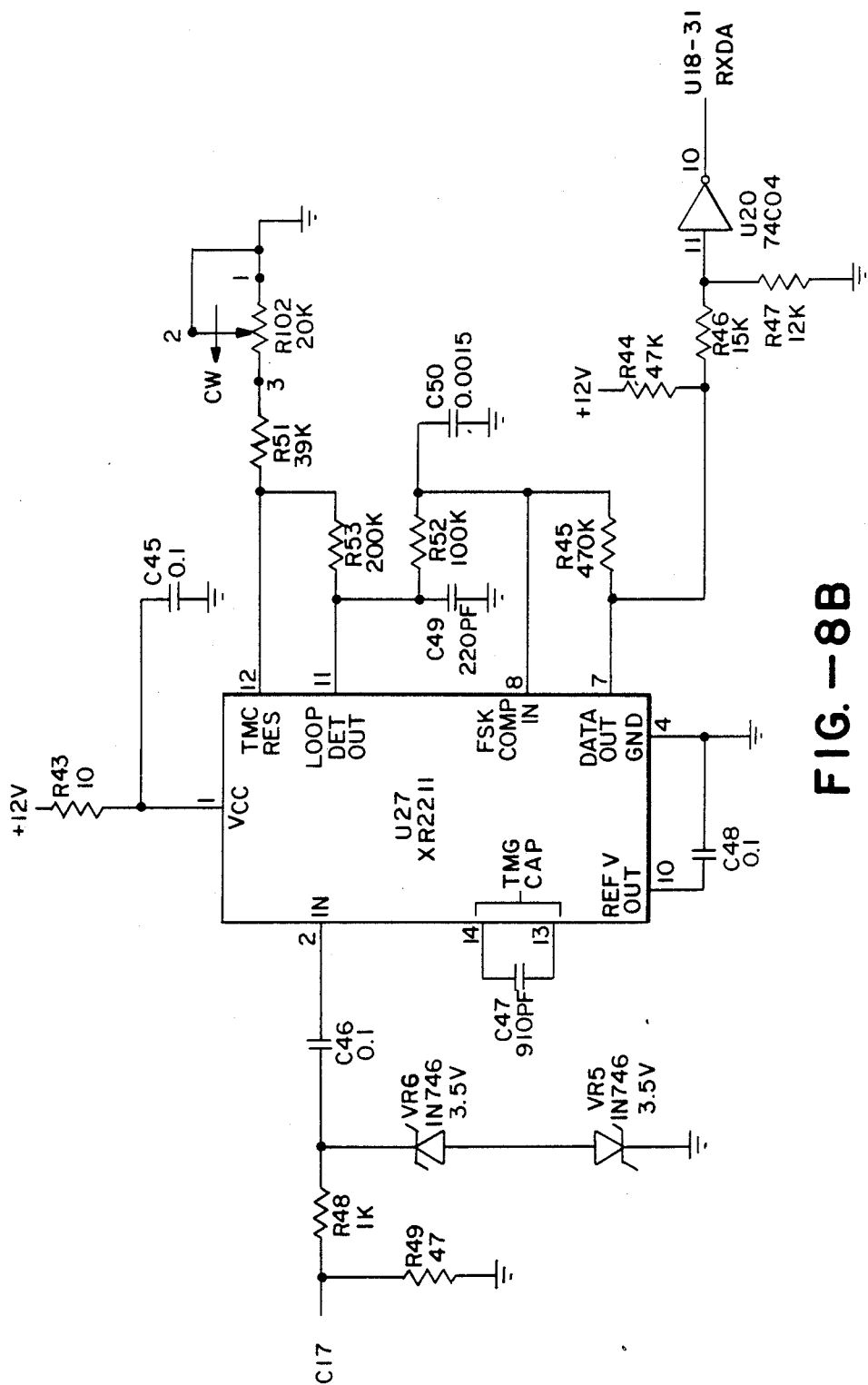
Figure 9A:
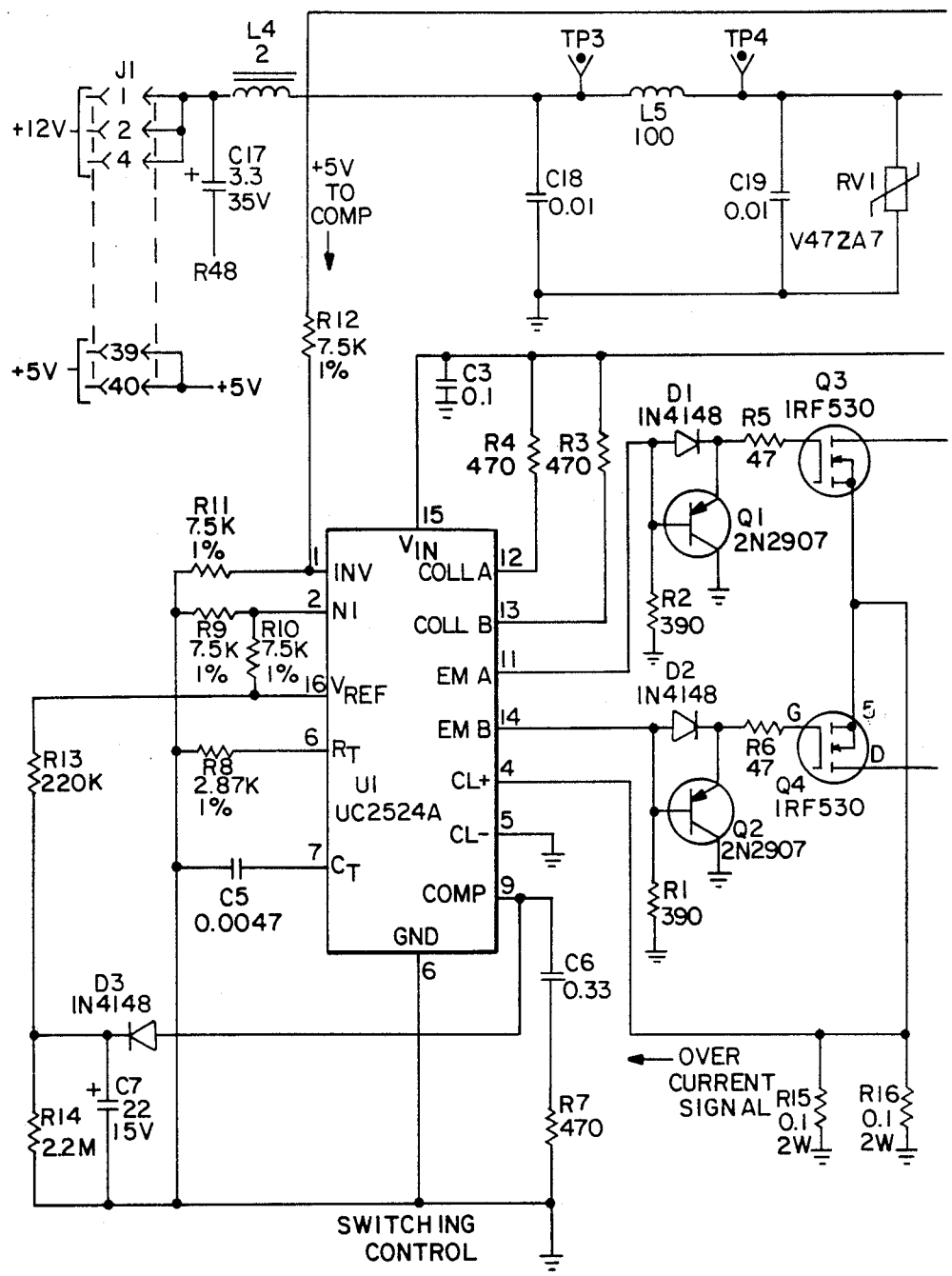
Figure 9B:
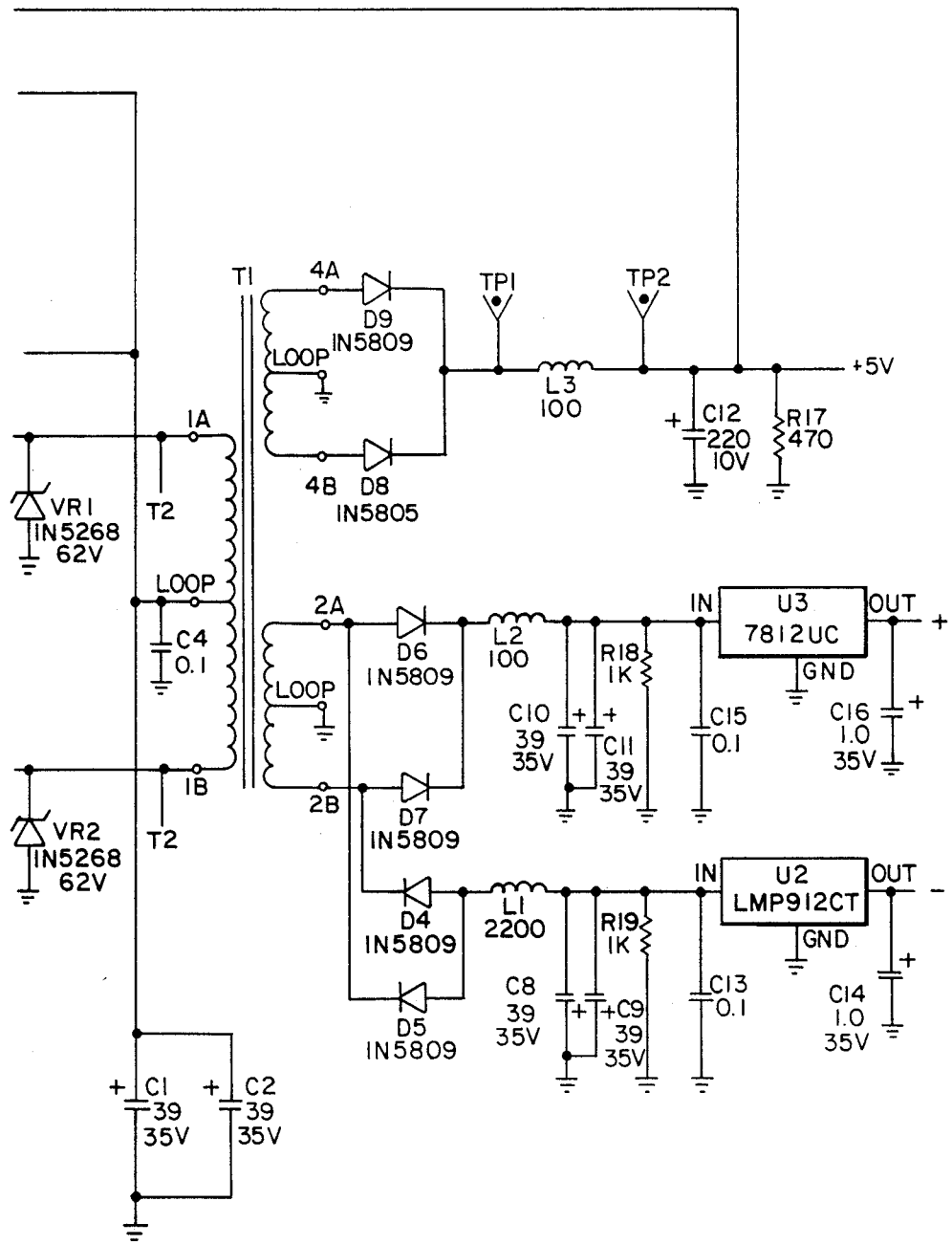
Figure 10A:
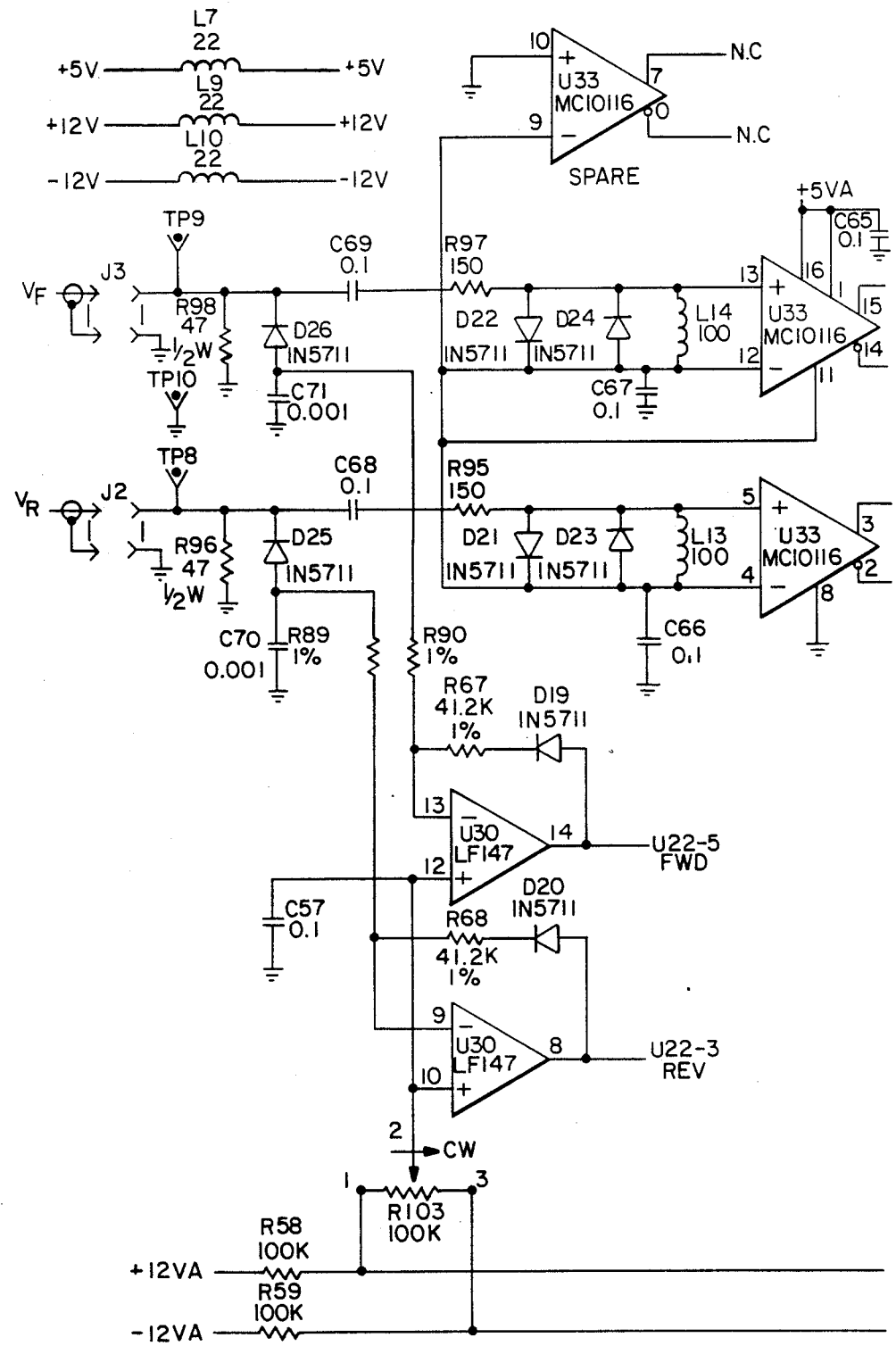
Figure 10B:
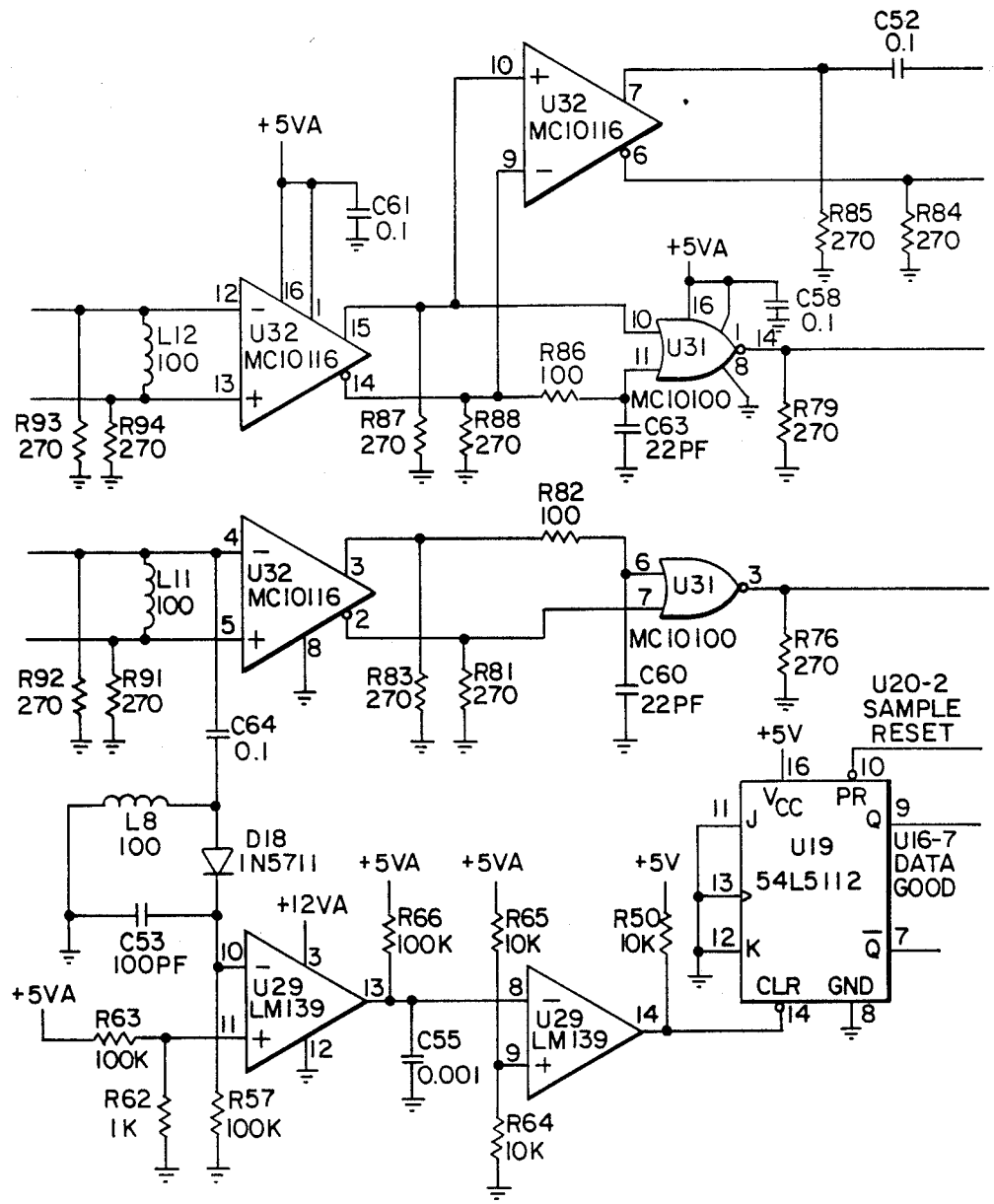
Figure 10C:
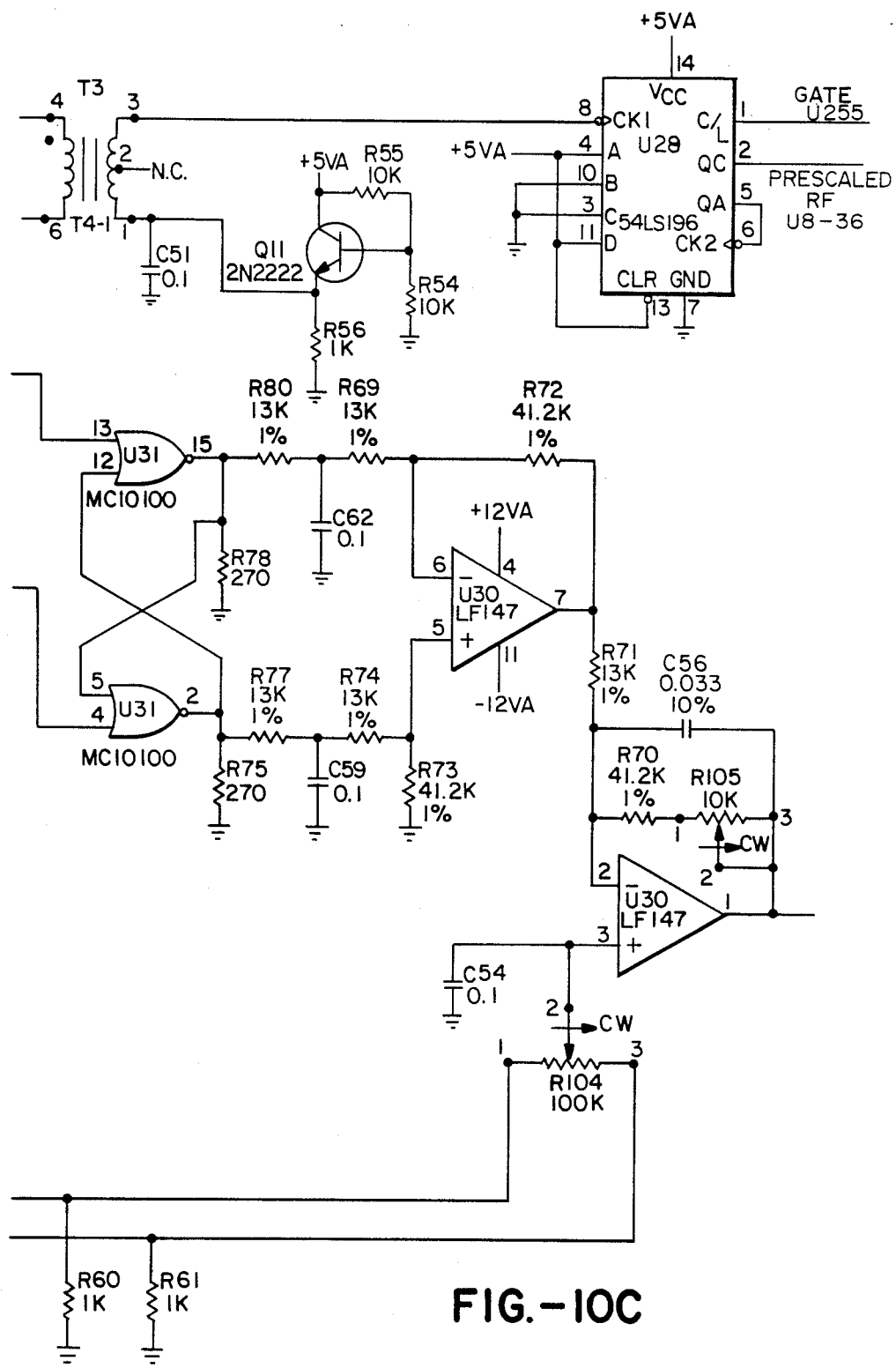

FIGS. 2, 3 and 4 depict schematic diagrams of the antenna coupler which show the aspects of the adjustable matching network 30 of FIG. 1.

FIGS. 5-10 depict schematic diagrams of the antenna tuner control of FIG. 1.

The components of FIGS. 2-10 are well known in the prior art, and consequently the operation of those schematic diagrams need not be described in any great detail.

What is claimed is:

1. An antenna coupler comprising:
   adjustable impedance matching network means for matching the output impedance of a transmitter at a radio frequency (RF) input to the input impedance of a non-broadband antenna,
   means for tracking a swept, transmitted signal at said RF input, and
   processor means responsive to the tracked signal for automatically adjusting said impedance matching network means to provide an impedance match between said output impedance and said input impedance wherein said processor means includes means for dividing the swept frequency range into discrete bands,
   means for determining the frequency of said input signal to be matched for each of said bands, and for determining any changes in the frequency of said input signal,
   means for measuring and quantifying the value of the impedance itself at said antenna for each of the determined frequencies,
   means for calculating the amount of adjustment needed to match said output impedances and said input impedances based upon measured value of impedance for each of said determined frequencies, so as to provide an impedance match for each of said discrete bands.

2. The coupler as in claim 1 wherein the range of said swept transmitted signal is approximately 1.6 MHz to 30 MHz.

3. The coupler as in claim 1 wherein the range of said swept transmitted signal is approximately 1.6 MHz to 16 MHz.

4. The coupler as in claim 1 wherein said processor means includes means for storing said values of the required impedance for each of said discrete bands, and means for recalling said stored values for each of said discrete bands.

5. An antenna coupler comprising
   adjustable impedance matching network means for matching the output impedance of a transmitter at a radio frequency (RF) input to the input impedance of a non-broadband antenna,
   means for detecting changes in said output impedance when an RF signal is transmitted to said RF input,
   means for measuring and quantifying the value of the impedance itself at said antenna,
   means for calculating the amount of adjustment needed to match said output impedances and said input impedances based upon the measured value of impedance,
   means for rematching said output impedance to said input impedance if the detected changes vary from a certain predetermined value.

6. The coupler as in claim 5 wherein said transmitted signal is a fixed frequency RF signal.

7. The coupler as in claim 5 wherein said transmitted signal is a swept transmitted signal.

8. An antenna coupler comprising
adjustable impedance matching network means for matching the output impedance of a transmitter at a radio frequency (RF) input to the input impedance of a non-broadband antenna,
means for measuring and quantifying the impedance value itself of said antenna,
means for calculating the amount of adjustment needed to match said output impedances and said input impedances based upon the measured impedance value, and
means for adjusting said adjustable impedance matching network means to match said output and input impedances.

9. The coupler as in claim 8 wherein said transmitted frequency is a fixed RF frequency.

10. The coupler as in claim 8 wherein said transmitted frequency is a swept transmitted RF signal and wherein said processor means includes means for dividing said swept frequency range into discrete bands.

11. The coupler as in claim 10 including storage means for storing values representing the calculated amount of adjustment for each of said discrete bands.

12. The coupler as in claim 11 including means for recalling said stored values for each of said discrete bands.

* * * * *